(12) United States Patent
Smith

(10) Patent No.: US 8,076,988 B2
(45) Date of Patent: *Dec. 13, 2011

(54) VOLTAGE AND CURRENT SIGNALING

(75) Inventor: David E. Smith, Vancouver, WA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 426 days.

This patent is subject to a terminal disclaimer.

(21) Appl. No.: 12/394,465

(22) Filed: Feb. 27, 2009

(65) Prior Publication Data
US 2010/0219900 A1 Sep. 2, 2010

(51) Int. Cl.
H03C 3/00 (2006.01)

(52) U.S. Cl. .......... 332/118; 332/124; 702/64; 324/522; 323/234

(58) Field of Classification Search .................. 332/118, 332/124; 323/234; 324/522; 702/64
See application file for complete search history.

(56) References Cited

U.S. PATENT DOCUMENTS

| 3,058,069 | A | 10/1962 | Sun |
| 5,406,137 | A | 4/1995 | Scheler et al. |
| 5,994,972 | A | 11/1999 | Katsui |
| 6,281,732 | B1 | 8/2001 | Mirow |
| 6,507,797 | B1 * | 1/2003 | Kliman et al. ............. 702/75 |
| 7,385,453 | B2 | 6/2008 | Nervegna |
| 7,911,286 | B2 * | 3/2011 | Smith ........................ 332/118 |

* cited by examiner

Primary Examiner — James E Goodley
(74) Attorney, Agent, or Firm — Scott Gallert

(57) ABSTRACT

Circuitry and methods are provided. Voltage and current of an electrical load are detected, scaled and biased to derive respective voltage and current signals. Frequency-modulated signals corresponding to the voltage and current signals are respectively derived. The frequency-modulated signals are communicated between different electrical domains by way of optical isolation barriers. The frequency-modulated signals are processed to improve linearity and to time-correlate the signals to discrete samplings of the load voltage and current. Control of a printer or other device is performed using the processed signals.

15 Claims, 10 Drawing Sheets

VOLTAGE AND CURRENT SIGNALING

BACKGROUND

Various electrical and electronic devices use circuitry for sensing power consumption by a load or loads. In a typical instance, such sensing requires detecting the voltage applied to the load, as well as the current through the load. The mathematical product of load voltage and load current corresponds to the instantaneous power consumption of the load. The load voltage, current and/or power can be provided as respective signals to control circuitry or other devices. Accordingly, the embodiments described hereinafter were developed in the interest of addressing the foregoing requirements.

BRIEF DESCRIPTION OF THE DRAWINGS

The present embodiments will now be described, by way of example, with reference to the accompanying drawings, in which.

DETAILED DESCRIPTION

Introduction

Means and methods for providing electrically isolated, frequency-modulated signals corresponding to a load voltage and a load current are provided by the present teachings. Voltage applied to a load and the current through the load are sensed. The respective voltage and current-sensing signals are scaled and biased to suitable levels. The scaled signals are coupled to respective modulators, which derive frequency-modulated signals corresponding to the load voltage and load current. The frequency-modulated signals are communicated across respective isolation barriers such that electrically isolated, frequency-modulated signals are provided. The electrically isolated signals can processed and used to control operations within a printing device or other apparatus.

In one embodiment, an apparatus includes first modulator circuitry that is configured to provide a first frequency-modulated signal corresponding to a voltage applied to a load. The apparatus also includes second modulator circuitry configured to provide a second frequency modulated signal corresponding to a current through the load. The apparatus further includes control circuitry that is configured to process the first and second frequency-modulated signals so as to derive first and second processed signals respectively. The processing including the removal of offset signal content from the first and second frequency-modulated signals. The control circuitry is also configured to control one or more aspects of the apparatus by way of the first and second processed signals.

In another embodiment, a printing apparatus includes an electrical load. The printing apparatus also includes signal derivation circuitry that is configured to provide a first electrically isolated signal corresponding to a voltage applied to the electrical load. The signal derivation circuitry is also configured to provide a second electrically isolated signal corresponding to a current through the electrical load. The printing apparatus further includes signal processing circuitry that is configured to remove offset signal content from the first and second electrically isolated signals, such that first and second processed signals are respectively derived.

In yet another embodiment, a method includes deriving a first frequency-modulated signal corresponding to a load voltage. The method also includes deriving a second frequency-modulated signal corresponding to a load current. Additionally, the method includes communicating the first and second frequency-modulated signals across respective electrical isolation barriers from a first voltage level to a second voltage level. The method further includes processing the first frequency-modulated signal and the second frequency-modulated signal so as to derive a first processed signal and a second processed signal, respectively. The method also includes using the first and second processed signals so as to control operations of a printer.

First Illustrative Embodiment

Figure 1:
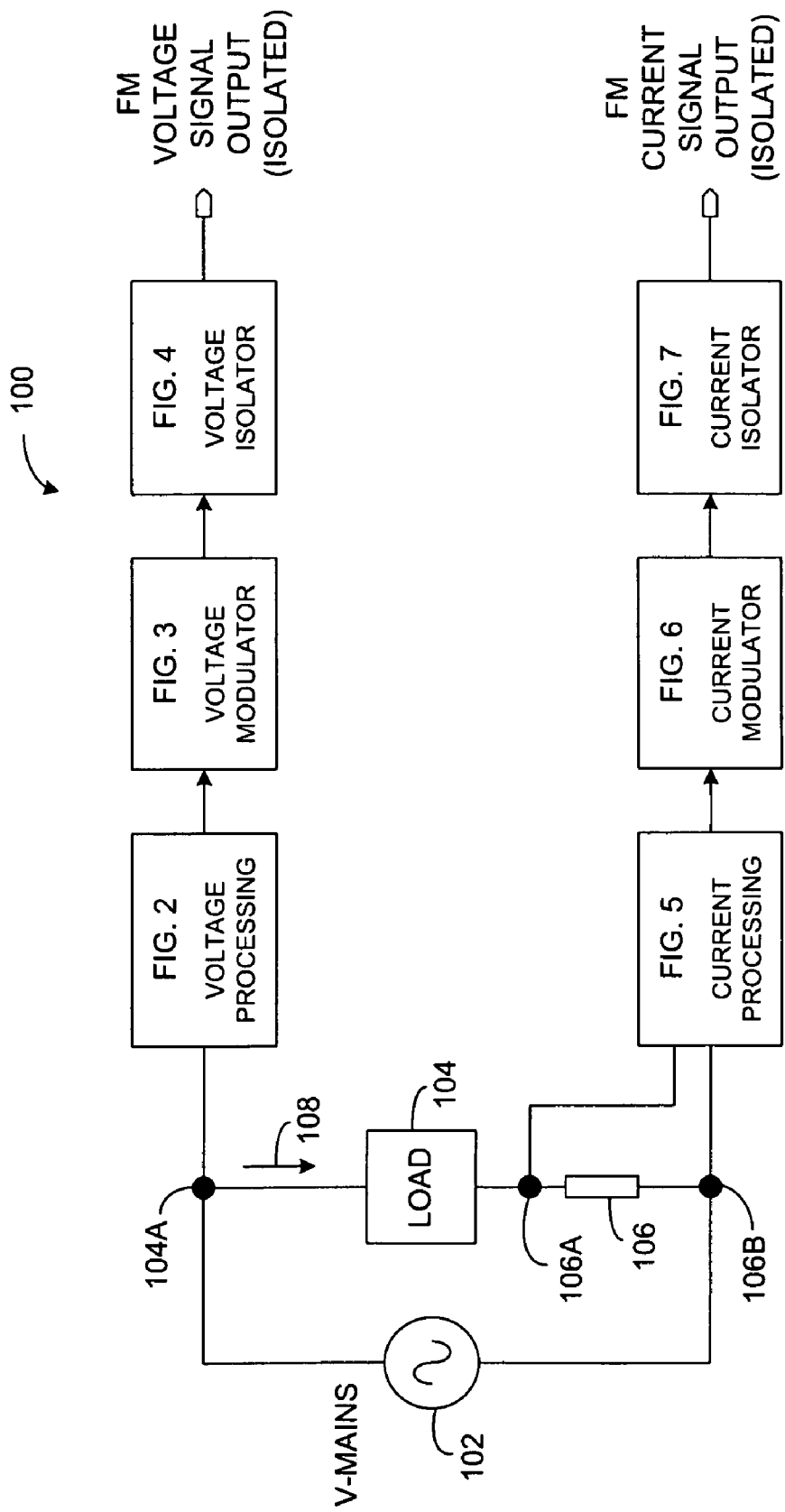
FIG. 1 depicts a block diagram of the interrelationship of FIGS. 2-7, which collectively depict signal derivation circuitry according to one embodiment.

An embodiment of signal derivation circuitry according to the present teachings is now described. Such signal derivation circuitry is shown by way of FIGS. 2-7, collectively. FIG. 1 is block schematic diagram 100 depicting the overall interrelationship of the circuitry depicted in FIGS. 2-7, as they interrelate to a typical operating scenario. It is to be understood that other embodiments of signal derivation circuitry can be used in accordance with the present teachings.

With reference to FIG. 1, a source of electrical potential (i.e., voltage) 102 is included. As shown, the source 102 is an alternating-current (AC) voltage source. Other sources being direct-current (DC) or AC in nature and of respectively different voltages can also be used. For purposes of non-limiting example, it is assumed that source 102 provides AC electrical energy of one-hundred twenty volts root-mean-square (RMS) potential at a frequency of sixty cycles per second (Hertz).

The diagram 100 also includes an electrical load 104. The load 104 can be any electrical component, device, circuit, or system that is electrically energized by way of the source 102. For purposes of non-limiting example, it is assumed that the load 104 is a power supply for a printer. The load 104 is coupled to the source 102 by way of nodes 104A and 106A. For purposes of non-limiting example, it is assumed node 104A is at "line" potential, while node 106B is at nearly "neutral" potential.

The diagram 100 further includes a sensing resistor 106. In one embodiment, the sensing resistor is a model BVR-Z-R0005 available from Isotek Corporation, Swansea, Mass., USA. The sensing resistor 106 is directly connected to nodes 106A and 106B, with node 106B being at "neutral" potential as provided by source 102. The sensing resistor 106 is connected in series circuit arrangement with the load 104. The sensing resistor 106 is configured to provide an electrical potential at nodes 106A and 106B corresponding directly to the electrical current 108 carried by the load 104. Thus, the sensing resistor 106 serves to provide a voltage signal between nodes 106A and 106B that directly corresponds to the instantaneous current 108 through the load 104. The current 108 can also be referred to as "load current" 108.

The signal derivation circuitry collectively depicted by FIGS. 2-7 is coupled to nodes 104A, 106A and 106B, respectively. Thus, the signal derivation circuitry is connected to detect (i.e., sense) both the instantaneous voltage applied to the load 104, as well as the instantaneous current 108 carried by the load 104. An embodiment of signal derivation circuitry according to the present teachings is now described.

Figure 2:
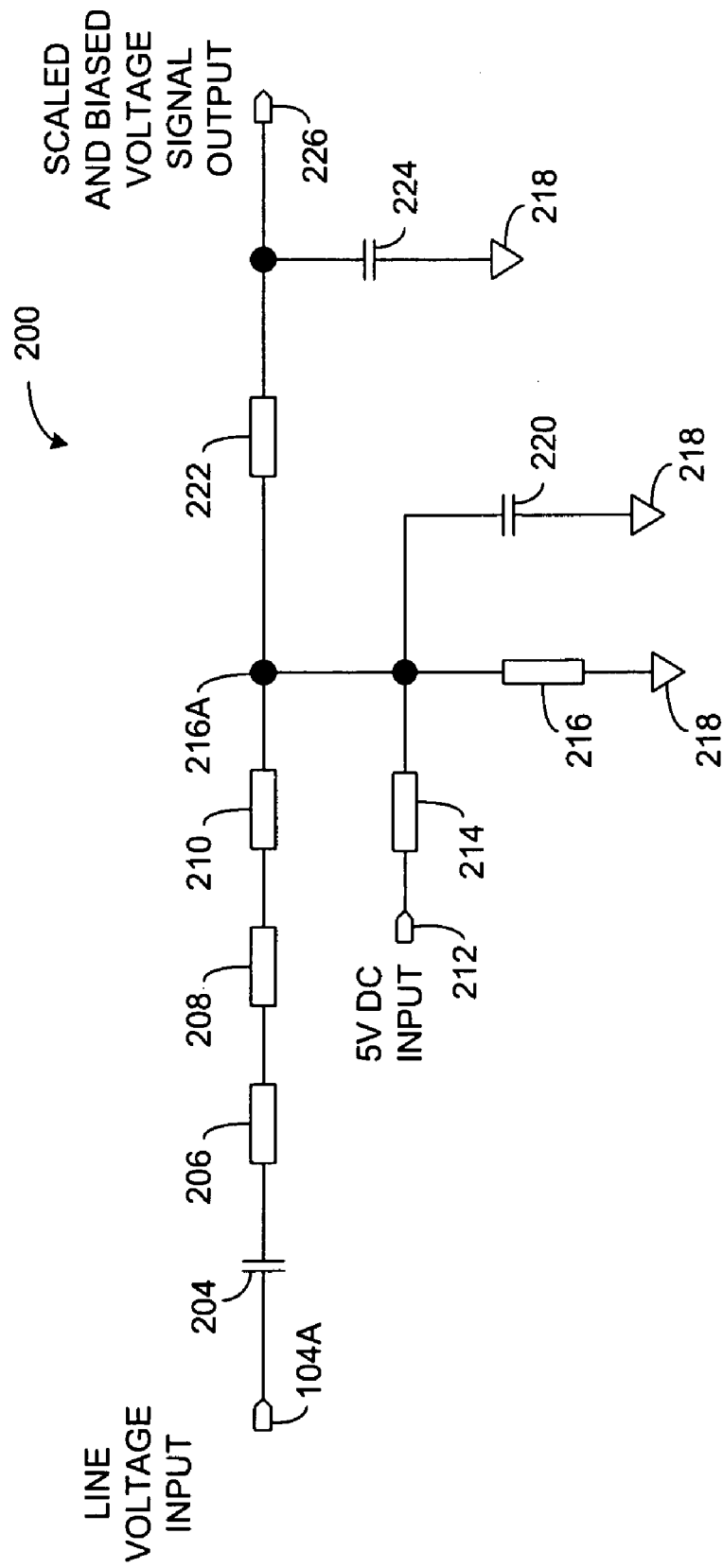
FIG. 2 depicts a schematic view of voltage signal processing circuitry according to the embodiment.

Referring now to FIG. 2, which depicts a schematic diagram of voltage signal processing circuitry 200. The circuitry 200 is coupled to one side of the potential provided by source 102 at node 104A. As described above, node 104A is at line potential (e.g., one-hundred twenty volts with respect to neutral node 106B). Thus, circuitry 200 is coupled to sense the voltage (with respect to a ground reference node) that energizes the load 104.

Circuitry 200 includes an AC coupling capacitor 204, and resistors 206, 208 and 210. In another embodiment (not shown), the AC coupling capacitor 204 is omitted and DC coupling is established to node 104A. The capacitor 204 and the resistors 206-210 are configured in series circuit arrangement and function to limit the electrical potential provided at an internal node 216A. The circuitry 200 also includes resistors 214 and 216, which are connected in series arrangement between five volts of DC potential at a node 212 and ground potential at a node 218. The resistors 214 and 216 operate so as to bias the node 216A at a level greater than ground (i.e., zero) voltage potential.

The circuitry 200 also includes resistor 222 that couples node 216A to an output node 226. The circuitry 200 further includes filter capacitors 220 and 224, which are coupled to ground potential at node 218. Overall, the circuitry 200 operates to provide a scaled and biased (i.e., shifted) voltage signal at node 226 that corresponds to the load voltage sensed at node 104A. For purposes of non-limiting example, it is assumed that the voltage signal at node 226 is an AC signal superimposed on a DC bias so as to remain above ground potential, so long as the AC load voltage at node 104A remains within a predetermined range.

Table 1 below summarizes the values of the various components depicted in the voltage signal processing circuitry 200:

TABLE 1

Voltage Signal Processing Circuitry 200

| Element/Device | Value/Model | Notes/Vendor |
| --- | --- | --- |
| Capacitor 204 | 1.0 uF | 50 V, 10% |
| Resistor 206 | 422K | 0.25 W, 1% |
| Resistor 208 | 422K | 0.25 W, 1% |
| Resistor 210 | 422K | 0.25 W, 1% |
| Resistor 214 | 500.0 | 0.1 W, 1% |
| Resistor 216 | 3.0K | 0.1 W, 1% |
| Capacitor 220 | 1.0 uF | 50 V, 20% |
| Resistor 222 | 75K | 0.1 W, 1% |
| Capacitor 224 | 4.7 nF | 50 V, 10% |

Figure 3:
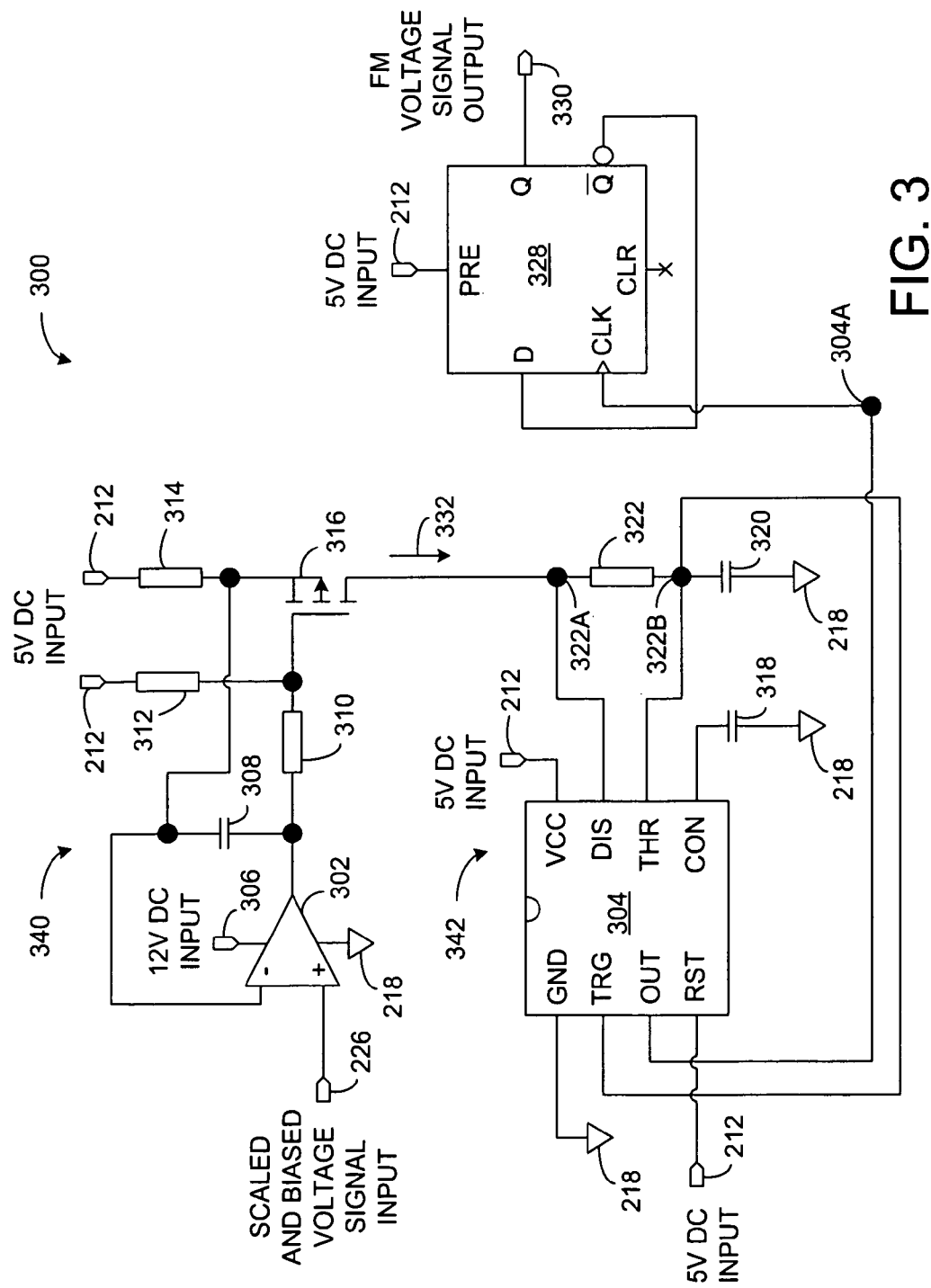
FIG. 3 depicts a schematic view of frequency-modulated voltage signal circuitry according to the embodiment.

Referring now to FIG. 3, which depicts a schematic view of modulator circuitry 300. The circuitry 300 includes an operational amplifier (op-amp) 302. The op-amp 302 is defined by, or as a portion of, a model LM324 Quad Operational Amplifier available from National Semiconductor Corporation, Santa Clara, Calif., USA. The op-amp 302 is connected to ground potential at node 218 and to twelve volts DC potential at node 306. The non-inverting input of the op-amp 302 is connected to the scaled and biased voltage signal at node 226 as described above.

The circuitry 300 includes a capacitor 308, resistors 310, 312 and 314, and a transistor 316. The transistor 316 is defined by a P-channel metal-oxide semiconductor field-effect transistor (MOSFET), being model BSS84 available from Fairchild Semiconductor Corporation, San Jose, Calif., USA. The op-amp 302, capacitor 308, resistors 310-314 and transistor 316 are coupled and configured to define a voltage-to-current converter 340, wherein the current path is driven by five volts of DC potential at node 212.

The circuitry 300 includes an integrated circuit (IC) timer 304. The integrated circuit 304 is defined by model NE555 Timer available from Fairchild Semiconductor Corporation, San Jose, Calif., USA. The timer 304 is coupled to five volt energy at node 212 and ground potential at node 218. The timer 304 is also coupled to capacitor 318, timing capacitor 320 and resistor 322. The timer 304 is configured to operate as an oscillator 342 by way of the cyclic charging and discharging of the capacitor 320 through the resistor 322. Further operation of the timer 304 and corresponding oscillator 342 is described hereinafter.

The circuitry 300 also includes a "D" or data-type flip-flop 328. The flip-flop 308 is defined by a model MC74HC74A available from On Semiconductor, Phoenix, Ariz., USA. The flip-flop 328 is configured to be triggered (or clocked) by an output signal from the timer 304. The flip-flop 328 provides a digital output signal at node 330.

During normal operation, the circuitry 300 performs as follows: the scaled and biased voltage signal at node 226 is provided to the op-amp 302. In turn, the op-amp 302 and elements 308-316 function to convert the instantaneous voltage signal at node 226 to a current signal 332. The current signal 332 charges the capacitor 320 through resistor 322. The voltage across capacitor 320 is sensed by the timer 304 at node 322B. During the charging of the capacitor, the output signal from the timer 304 at node 304A is asserted "high" (i.e., toward five volts DC).

Once the capacitor 320 voltage at node 322B rises to a predetermined threshold level (e.g., ten-thirds of a volt, etc.), the timer 304 provides ground potential at node 322A, which serves to sink the current 332 and to discharge the capacitor 320 through the resistor 322. During the discharging of the capacitor 320, the output signal at node 304A is asserted "low" (i.e., toward ground potential). Once the capacitor 320 voltage decays to a predetermined lower threshold (e.g., five-thirds of a volt, etc.), the timer 304 discontinues the ground potential at node 322A, and the capacitor begins charging once again by virtue of the current 332.

The oscillator 342, which is based on the timer 304 and associated components, functions to provide a frequency-modulated (FM) signal that clocks the operation of the flip-flop 328. The instantaneous operating frequency of the oscillator 342 is determined by the instantaneous current 332 provided by the voltage-to-current converter 340. Thus, the frequency-modulated output signal from the oscillator 342 corresponds to the load voltage sensed at node 104A. The frequency-modulated signal from the oscillator 342 is divided in half by operation of the flip-flop 328 and a digital, frequency-modulated voltage signal is provided at node 330. The instantaneous frequency of the FM voltage signal at node 330 decreases as the instantaneous load voltage at node 104A increases.

Table 2 below summarizes the values of the various components depicted in modulator circuitry 300:

TABLE 2

Modulator Circuitry 300

| Element/Device | Value/Model | Notes/Vendor |
| --- | --- | --- |
| Op-Amp 302 | LM324 | National Semiconductor |
| Timer 304 | NE555 | Fairchild Semiconductor |
| Capacitor 308 | 10 pF | 50 V, 10% |
| Resistor 310 | 100 | 0.1 W, 1% |
| Resistor 312 | 10K | 0.1 W, 1% |
| Resistor 314 | 75.00K | 0.1 W, 1% |
| Transistor 316 | BSS84 | Fairchild Semiconductor |
| Capacitor 318 | 10 nF | 50 V, 10% |
| Capacitor 320 | 1.0 nF | 50 V, 10% |
| Resistor 322 | 1.0K | 0.1 W, 1% |
| Flip-Flop 328 | MC74HC74A | On Semiconductor |

Figure 4:
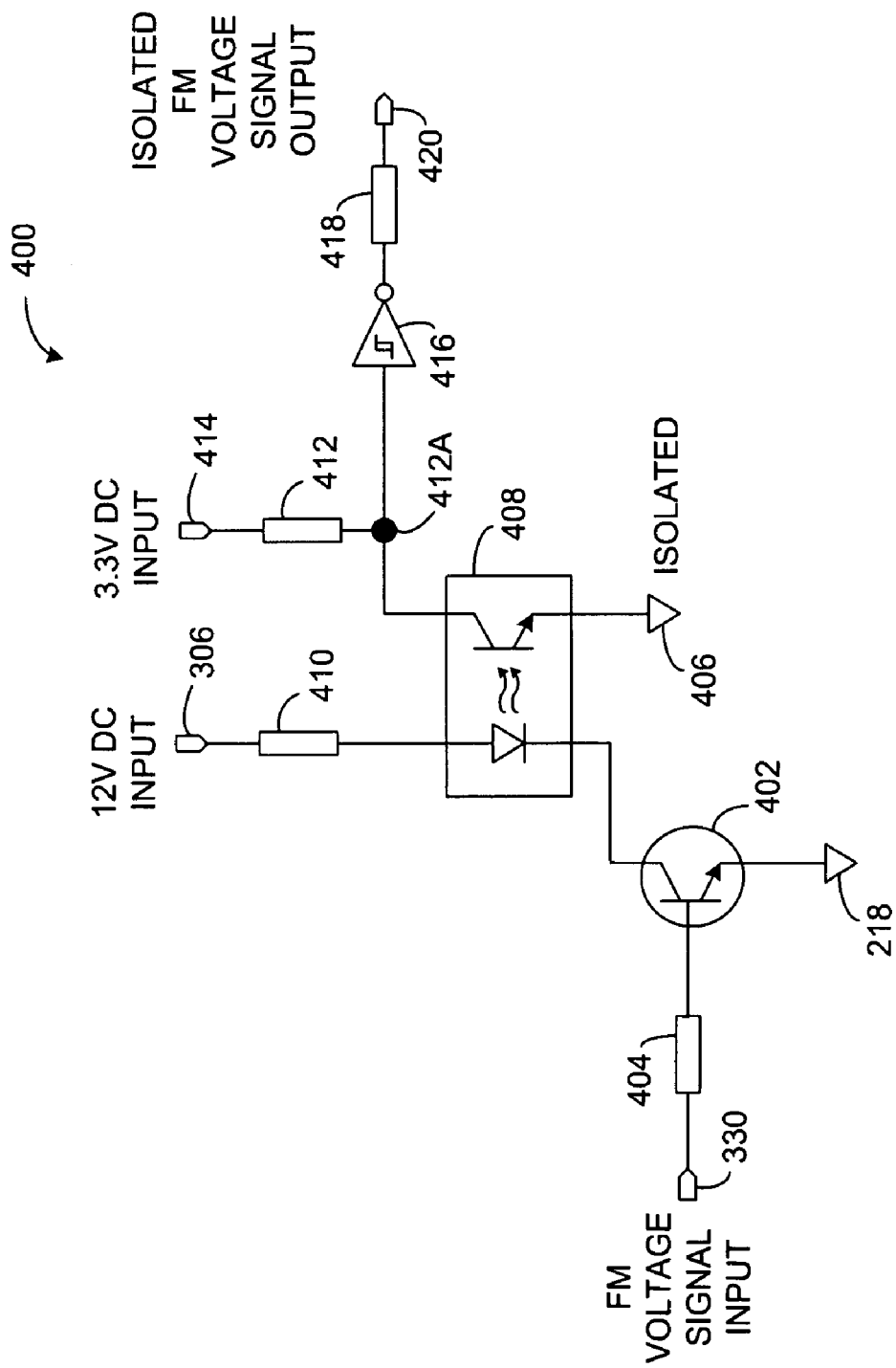
FIG. 4 depicts a schematic view of isolation barrier circuitry according to the embodiment.

Referring now to FIG. 4, which depicts a schematic view of isolation circuitry 400. The circuitry 400 includes a transistor 402. The transistor 402 is an NPN bipolar transistor. One suitable model of transistor 402 is type 2N2222 available from Micro Commercial Components, Chatsworth, Calif., USA. Other suitable transistors can also be used. The transistor 402 includes an emitter connected to ground potential at node 218, and a base coupled to node 330 by way of a resistor 404. The digital, frequency-modulated voltage signal described above is provided at node 330.

The circuitry 400 also includes an optical isolator (opto-isolator or optocoupler) 408. The opto-isolator 408 is a model 4N25 available from Fairchild Semiconductor Corporation, San Jose, Calif., USA. The collector of transistor 402 is connected to the cathode side of an optical emitter (i.e., light emitting diode) internal to the opto-isolator 408. In turn, the anode side of the optical emitter is coupled to twelve volts DC potential at node 306 through a resistor 410.

The opto-isolator 408 includes an internal phototransistor, of which the emitter is connected to an isolated ground potential at node 406. It is important to note that the ground potential at node 406 is electrically isolated and distinct from the ground potential at node 218. The collector of the phototransistor is biased toward three-point-three volts DC potential at node 414 by way of a resistor 412. Other suitable voltages can also be used. However, it is important to note that the potential at node 414 and its associated ground potential at node 406 define an electrical domain that is isolated and distinct from that of the potential at node 306 and associated ground node 218. The opto-isolator 408 serves as an electrical barrier between two distinct voltage levels (i.e., electrical domains).

The circuitry 400 further includes an inverting Schmitt trigger 416. One suitable model of Schmitt trigger 406 is type MC74HC14A available from On Semiconductor, Phoenix, Ariz., USA. The Schmitt trigger 416 is coupled to receive an output signal from the opto-isolator 408 at node 412A. The Schmitt trigger 416 is further configured to provide an inverted form of the signal at node 412A (subject to hysteresis) at an output node 420 by way of a resistor 418.

During normal operation, the circuitry 400 performs as follows: the digital, frequency-modulated voltage signal at node 330 is coupled to the base of transistor 402. In turn, the transistor 402 operates to drive the input side of the opto-isolator with an inverted form of the FM signal at node 330. The opto-isolator 408 communicates the input signal across the electrical isolation barrier from the first electrical domain (i.e., twelve volts) to the second electrical domain (i.e., three-point-three volts) by way of internal light wave signaling.

Thus, the FM voltage signal at node 330, in inverted and level-shifted form, is effectively communicated to node 412A by way of the opto-isolator 408.

The Schmitt trigger 416 receives the signal at node 412A and provides an inverted form of that signal, subject to noise-filtering hysteresis, to resistor 418. Thus, the output of the Schmitt trigger 416 is non-inverted with respect to the frequency-modulated voltage signal at node 330. Finally, the frequency-modulated voltage signal, in electrically isolated and level-shifted form, is provided to output node 420. The frequency-modulated voltage signal at node 420 can be routed as needed or desired for use in controlling other circuitry or equipment (see FIG. 8).

Table 3 below summarizes the values of the various components depicted in isolation circuitry 400:

TABLE 3

Isolation Circuitry 400

| Element/Device | Value/Model | Notes/Vendor |
| --- | --- | --- |
| Transistor 402 | 2N2222 | Micro Comm. Components |
| Resistor 404 | 10K | 0.1 W, 1% |
| Opto-Isolator 408 | 4N25 | Fairchild Semiconductor |
| Resistor 410 | 1.1K | 0.1 W, 1% |
| Resistor 412 | 10K | 0.1 W, 1% |
| Schmitt Trig. 416 | MC74HC14A | On Semiconductor |
| Resistor 418 | 200.0 | 0.1 W, 1% |

The modulator circuitry 300 as described above includes an oscillator 342 that functions by virtue of charging and discharging of a capacitor 320. During operation, each timing period is comprised of a charge time (Tc) and a discharge time (Td), such that each period (P) is defined as: P=Tc+Td. Operating frequency (F) for each oscillator is defined as the reciprocal of the period, or: F=1/P.

During each charge time Tc, the nature and rate of the voltage increase (dV/dT) across the capacitor 320 corresponds directly to the current 332. If the current 332 is constant during a given charge time Tc, then that voltage rise across the capacitor 320 increases linearly with respect to time. During each discharge time Td, the voltage decay across the capacitor 320 is non-linear (i.e., logarithmic) by virtue of the simple resistor-capacitor circuit arrangement.

Typically, but not necessarily, the present teachings contemplate the selection of circuit component values (e.g., capacitor 320, resistor 322, etc.) and voltage-to-current conversion gain that result in a charge time Tc that is significantly greater than the discharge time Td for each timing period. Under such a scheme, a generally linear correspondence between load voltage (node 104A) and voltage signal frequency (node 330) is achieved.

Furthermore, the present teachings contemplate processing the isolated frequency-modulated voltage signal provided at node 420 so as to filter out the effects of the discharge time Td. Such subtraction of the Td characteristic—also referred to as removal of offset signal content—results in a favorable increase in the effective linearity of the derived voltage signal.

Figure 5:
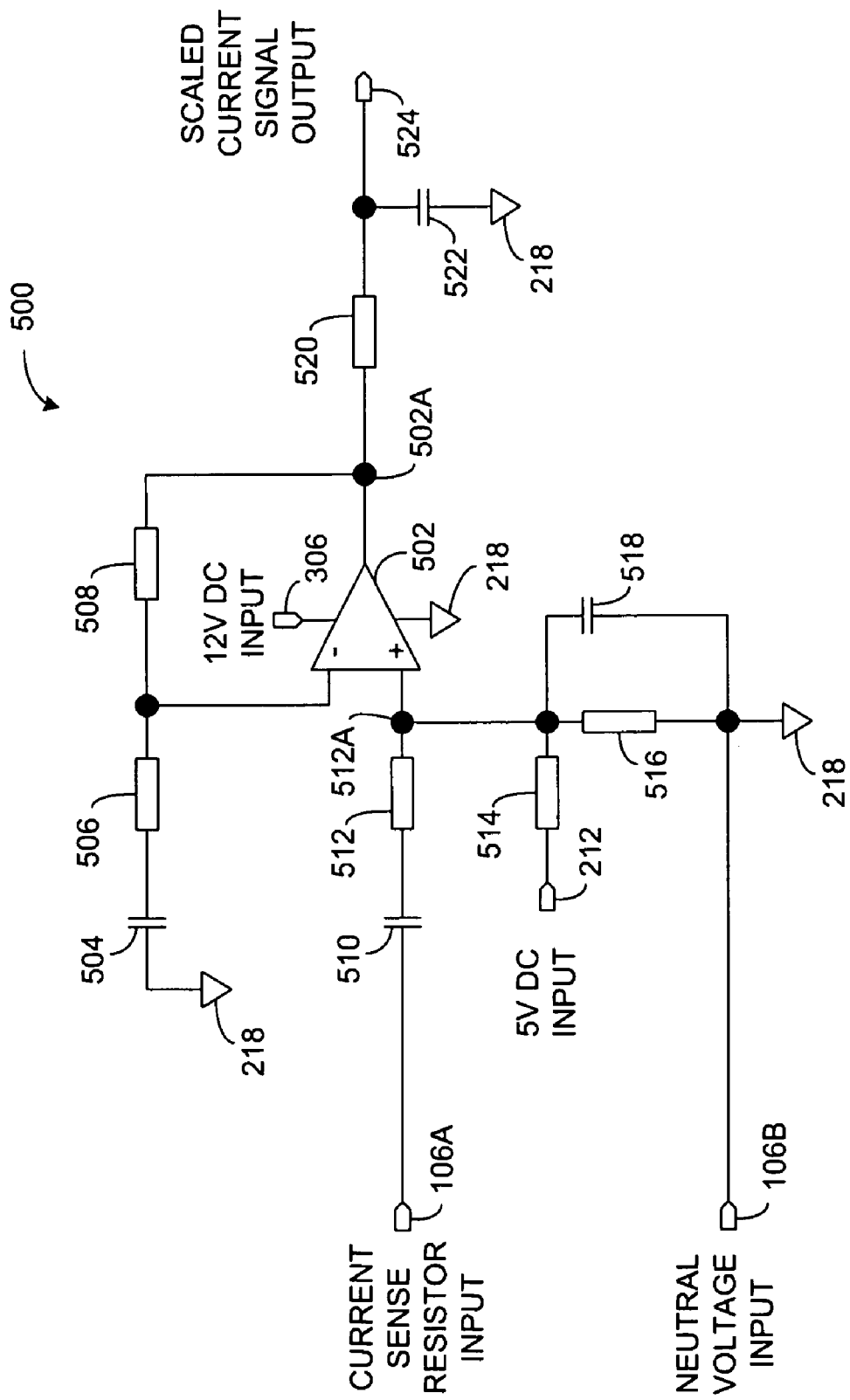
FIG. 5 depicts a schematic view of current signal processing circuitry according to the embodiment.

Referring now to FIG. 5, which depicts a schematic diagram of current signal processing circuitry 500. The circuitry 500 is coupled to one side of the current sense resistor 106 at node 106A. As described above, node 106A provides a voltage signal corresponding to the current 108 carried by load 104. The circuitry 500 is also coupled to neutral potential at node 106B.

The circuitry 500 includes an operational amplifier (op-amp) 502. The op-amp 502 is defined by, or as a portion of, a model LM324 Quad Operational Amplifier available from National Semiconductor Corporation, Santa Clara, Calif., USA. The op-amp 502 is connected to twelve volts DC potential at node 306 and ground potential at node 218. Resistors 506 and 508, and capacitor 504 are configured to define a feedback circuit path from the output node 502A to the inverting input, respectively, of the op-amp 502. The non-inverting input of the op-amp 502 is coupled to receive the current sensing signal at a node 512A by way of an AC coupling capacitor 510 and a resistor 512. As such, the op-amp 502 and associated components 504-512 are configured to define a non-inverting amplifier.

The circuitry 500 also includes resistors 514 and 516 and a filter capacitor 518. The resistors 514-516 and capacitor 518 are coupled to five volts potential at node 212 and ground potential at node 218. The resistors 514-516 and capacitor 518 are configured to provide a DC bias level to the node 512A at greater than ground potential. In this way, the node 512A carries the AC current sensing signal superimposed on a DC bias voltage. The op-amp 502 operates to scale (i.e., amplify) and buffer the signal at node 512A and provide a corresponding voltage signal, representative of the current 108, at the output node 502A. In another embodiment (not shown), the capacitors 504 and 510 can be omitted, and DC coupling of the current sense signal at node 106A is established.

The circuitry 500 further includes a resistor 520 that couples the signal at node 502A to an output node 524. In turn, a filter capacitor 522 operates to filter the voltage signal at node 524. While FIG. 5 depicts the output at node 524 as a "current" signal, it is to be appreciated that the signal at node 524 is in fact a voltage signal directly correspondent to the load current 108.

Table 4 below summarizes the values of the various components depicted in regulator circuitry 500:

TABLE 4

Current Signal Processing Circuitry 500

| Element/Device | Value/Model | Notes/Vendor |
| --- | --- | --- |
| Op-Amp 502 | LM324 | National Semiconductor |
| Capacitor 504 | 47 uF | 50 V, 20% |
| Resistor 506 | 6.190K | 0.25 W, 1% |
| Resistor 508 | 75.00K | 0.25 W, 1% |
| Capacitor 510 | 47 uF | 50 V, 20% |
| Resistor 512 | 4.220K | 0.1 W, 1% |
| Resistor 514 | 75K | 0.1 W, 1% |
| Resistor 516 | 432K | 0.1 W, 1% |
| Capacitor 518 | 100 nF | 50 V, 20% |
| Resistor 520 | 75K | 0.1 W, 1% |
| Capacitor 522 | 4.7 nF | 50 V, 20% |

Figure 6:
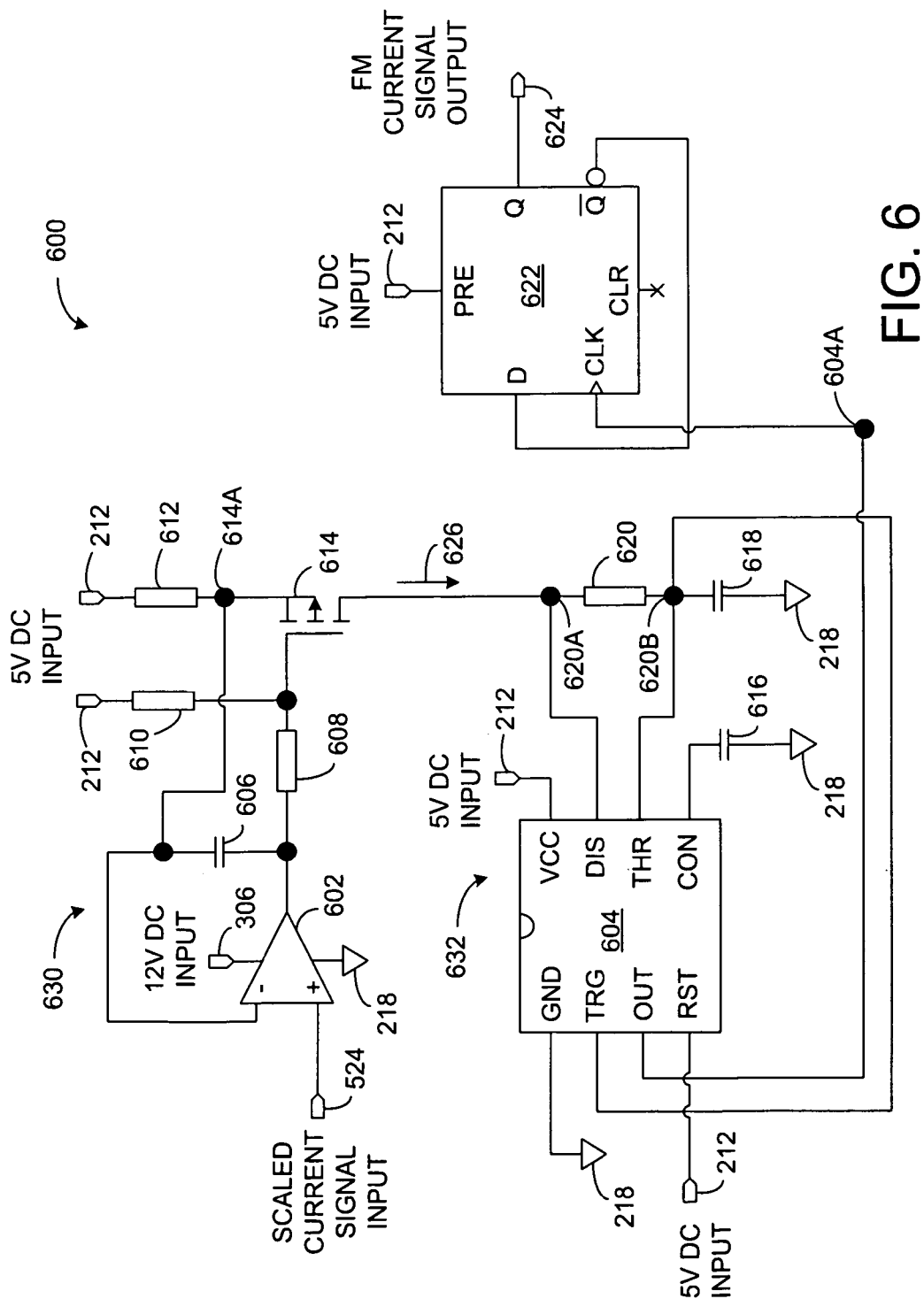
FIG. 6 depicts a schematic view of frequency-modulated current signal circuitry according to the embodiment.

Referring now to FIG. 6, which depicts a schematic view of modulator circuitry 600. The circuitry 600 includes an operational amplifier (op-amp) 602. The op-amp 602 is defined by, or as a portion of, a model LM324 Quad Operational Amplifier available from National Semiconductor Corporation, Santa Clara, Calif., USA. The op-amp 602 is connect to ground potential at node 218 and twelve volts DC potential at node 306. The non-inverting input of the op-amp 602 is connected to the scaled and buffered current signal (in voltage form) at node 524 as described above.

The circuitry 600 includes a capacitor 606, resistors 608, 610 and 612, and a transistor 614. The transistor 614 is defined by a P-channel metal-oxide semiconductor field-effect transistor (MOSFET), being model BSS84 available from Fairchild Semiconductor Corporation, San Jose, Calif., USA. The op-amp 602, capacitor 606, resistors 608-612 and transistor 614 are coupled and configured to define a voltage-to-current converter 630, wherein the current path is driven by five volts DC pat node 212.

The circuitry 600 includes an integrated circuit (IC) timer 604. The integrated circuit 604 is defined by model NE555 Timer available from Fairchild Semiconductor Corporation, San Jose, Calif., USA. The timer 604 is coupled to five volt energy at node 212 and ground potential at node 218. The timer 604 is also coupled to capacitor 616, timing capacitor 618 and resistor 620. The timer 604 is configured to operate as an oscillator 632 by way of the cyclic charging and discharging of the capacitor 618 through the resistor 620. Further operation of the timer 604 and corresponding oscillator 632 is described hereinafter.

The circuitry 600 also includes a "D" or data-type flip-flop 622. The flip-flop 622 is defined by a model MC74HC74A available from On Semiconductor, Phoenix, Ariz., USA. The flip-flop 622 is configured to be triggered (or clocked) by an output signal from the timer 604. The flip-flop 622 provides a digital output signal at node 624.

During normal operation, the circuitry 600 performs as follows: the signal at node 524 is provided to the op-amp 602. In turn, the op-amp 602 and elements 606-614 function to convert the voltage signal at node 524, representative of load current 108, to a current signal 626. The current signal 626 charges the capacitor 618 through the resistor 620. The voltage across capacitor 618 is sensed by the timer 604 at node 620B. During the charging of the capacitor, the output signal from the timer 604, as provided to the clock input of the flip-flop 622, is asserted "high" (i.e., toward five volts DC).

Once the capacitor 618 voltage at node 620B rises to a predetermined threshold level (e.g., ten-thirds of a volt, etc.) the timer 604 provides ground potential at node 620A, which serves to sink the current 626 and discharge the capacitor 618 through the resistor 620. During the discharging of the capacitor 618, the output signal from the timer 604 is asserted "low" (i.e., toward ground potential). Once the capacitor 618 voltage decays to a predetermined lower threshold (e.g., five-thirds of a volt, etc.) the timer 604 discontinues the ground potential at node 620A, and the capacitor 618 begins charging once again by virtue of the current 626.

The oscillator 632, which is based on the timer 604 and associated components, functions to provide a frequency-modulated (FM) signal that clocks the operation of the flip-flop 622. The instantaneous operating frequency of the oscillator 632 is determined by the instantaneous current 626 provided by the voltage-to-current converter 630. Thus, the frequency-modulated output signal from the oscillator 632 directly corresponds to the load current 108 sensed at across resistor 106. The frequency-modulated signal from the oscillator 632 is divided in half by operation of the flip-flop 622 and a digital, frequency-modulated current signal is provided at node 624. The instantaneous frequency of the FM voltage signal at node 624 increases as the instantaneous load current 108, as sensed at node 106A, increases. While FIG. 6 depicts the output at node 624 as a "current" signal, it is to be appreciated that the signal at node 624 is in fact a digital, frequency-modulated voltage directly correspondent to the load 104 current.

Table 5 below summarizes the values of the various components depicted in modulator circuitry 600:

TABLE 5

| Modulator Circuitry 600 | | |
| --- | --- | --- |
| Element/Device | Value/Model | Notes/Vendor |
| Op-Amp 602 | LM324 | National Semiconductor |
| Timer 604 | NE555 | Fairchild Semiconductor |
| Capacitor 606 | 10 pF | 50 V, 10% |
| Resistor 608 | 100 | 0.1 W, 1% |
| Resistor 610 | 10K | 0.1 W, 1% |
| Resistor 612 | 75.00K | 0.1 W, 1% |
| Transistor 614 | BSS84 | Fairchild Semiconductor |
| Capacitor 616 | 10 nF | 50 V, 10% |
| Capacitor 618 | 1.0 nF | 50 V, 10% |
| Flip-Flop 328 | MC74HC74A | On Semiconductor |

Figure 7:
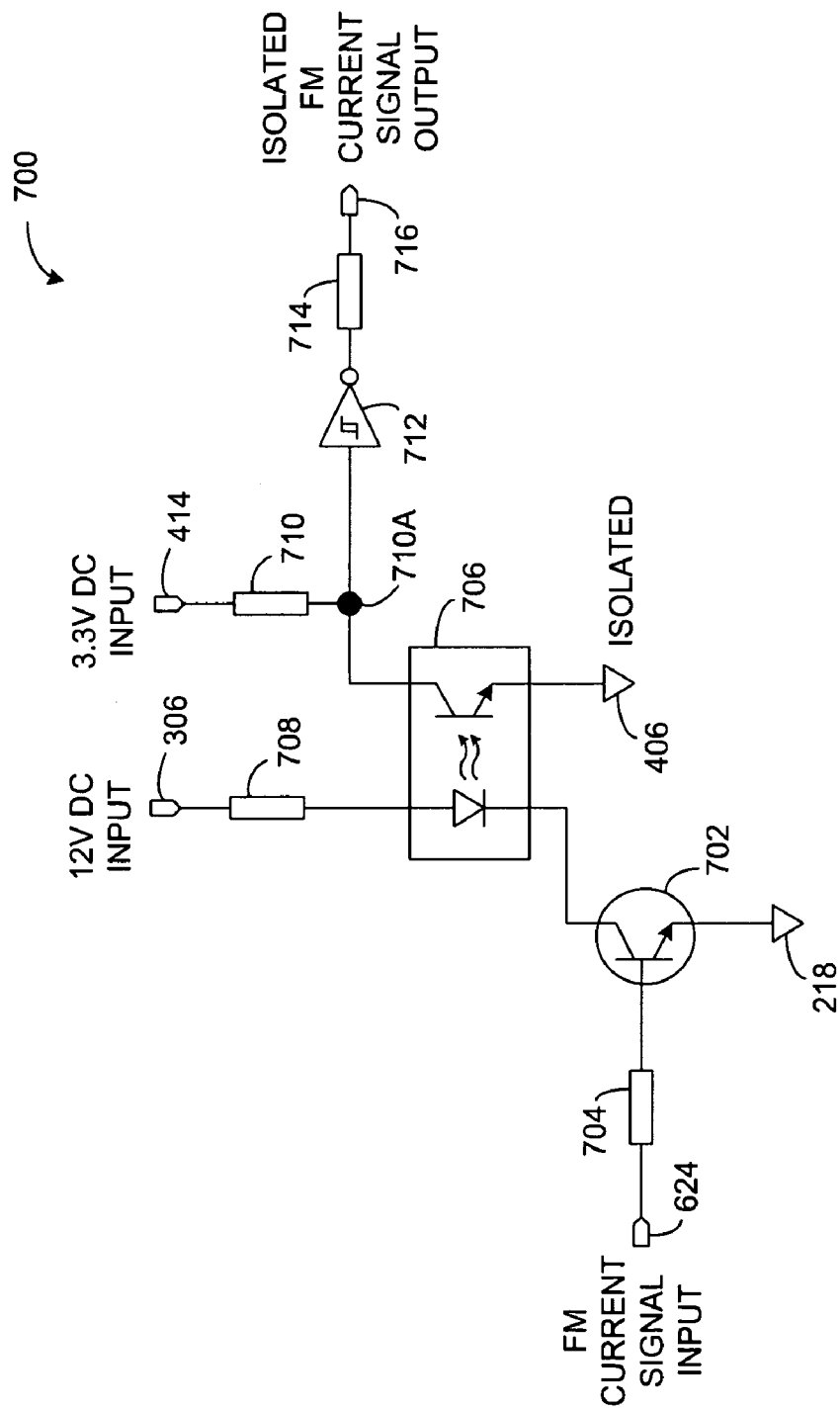
FIG. 7 depicts a schematic view of isolation barrier circuitry according to the embodiment.

Referring now to FIG. 7, which depicts a schematic view of isolation circuitry 700. The circuitry 700 includes a transistor 702. The transistor 702 is an NPN bipolar transistor. One suitable model of transistor 702 is type 2N2222 available from Micro Commercial Components, Chatsworth, Calif., USA. Other suitable transistors can also be used. The transistor 702 includes an emitter connected to ground potential at node 218, and a base coupled to node 624 by way of a resistor 704. The digital, frequency-modulated current signal described above is provided at a node 624.

The circuitry 700 also includes an optical isolator 706. The opto-isolator 706 is a model 4N25 available from Fairchild Semiconductor Corporation, San Jose, Calif., USA. The collector of transistor 702 is connected to the cathode side of an optical emitter (i.e., light emitting diode) internal to the opto-isolator 706. In turn, the anode side of the optical emitter is coupled to twelve volts DC potential at node 306 through a resistor 708.

The opto-isolator 706 includes an internal phototransistor, the emitter of which being connected to an isolated ground potential at node 406. It is important to note that the ground potential at node 406 is electrically isolated and distinct from the ground potential at node 218. The collector of the phototransistor is biased toward three-point-three volts DC potential at node 414 by way of a resistor 710. Other suitable voltages can also be used. However, it is important to note that the potential at node 414 and its associated ground potential at node 406 define an electrical domain that is isolated and distinct from that of the potential at node 306 and associated ground node 218. The opto-isolator 706 therefore operates as an electrical barrier between two distinct voltage levels (i.e., electrical domains).

The circuitry 700 further includes an inverting Schmitt trigger 712. One suitable model of Schmitt trigger 712 is type MC74HC14A available from On Semiconductor, Phoenix, Ariz., USA. The Schmitt trigger 712 is coupled to receive an output signal from the opto-isolator 706 at node 710A. The Schmitt trigger 712 is further configured to provide an inverted form of the signal from node 710A (subject to hysteresis) at an output node 716 by way of a resistor 714.

During normal operation, the circuitry 700 performs as follows: the digital, frequency-modulated current signal at node 624 is coupled to the base of transistor 702. In turn, the transistor 702 operates to drive the input side of the opto-isolator 706 with an inverted form of the FM signal at node 624. The opto-isolator 706 communicates the input signal across the electrical isolation barrier from the first electrical domain (i.e., twelve volts) to the second electrical domain (i.e., three-point-three volts) by way of internal light wave signaling. Thus, the FM voltage signal at node 624, in inverted and level-shifted form, is effectively communicated to node 710A by way of the opto-isolator 706.

The Schmitt trigger 712 receives the signal at node 710A and provides an inverted form of that signal, subject to noise-filtering hysteresis, to resistor 714. Thus, the output of the Schmitt trigger 712 is non-inverted with respect to the frequency-modulated current signal at node 624. Finally, the frequency-modulated current signal, in electrically isolated and level-shifted form, is provided to output node 716. The frequency-modulated current signal at node 716 can be routed as needed or desired for use in controlling other circuitry or equipment (see FIG. 8).

Table 6 below summarizes the values of the various components depicted in isolation circuitry 700:

TABLE 6

| Isolation Circuitry 700 | | |
| --- | --- | --- |
| Element/Device | Value/Model | Notes/Vendor |
| Transistor 702 | 2N2222 | Micro Comm. Components |
| Resistor 704 | 10K | 0.1 W, 1% |
| Opto-Isolator 706 | 4N25 | Fairchild Semiconductor |
| Resistor 708 | 1.1K | 0.1 W, 1% |
| Resistor 710 | 10K | 0.1 W, 1% |
| Schmitt Trig. 416 | MC74HC14A | On Semiconductor |
| Resistor 714 | 200.0 | 0.1 W, 1% |

The operating characteristics (e.g., Tc, Td, P, etc.) of the oscillator 632 of the modulator circuitry 600 are substantially the same as those described above with respect to the oscillator 342 of the modulator circuitry 300. Thus, the linearity of the frequency-modulated current signal is generally increased when discharge time Td is minimized by way of modulator circuit 600 design. Furthermore, the present teachings contemplate the same sort of post-derivation signal processing for the isolated FM current signal as described above for the isolated FM voltage signal.

Illustrative Signal Operations

Figure 8:
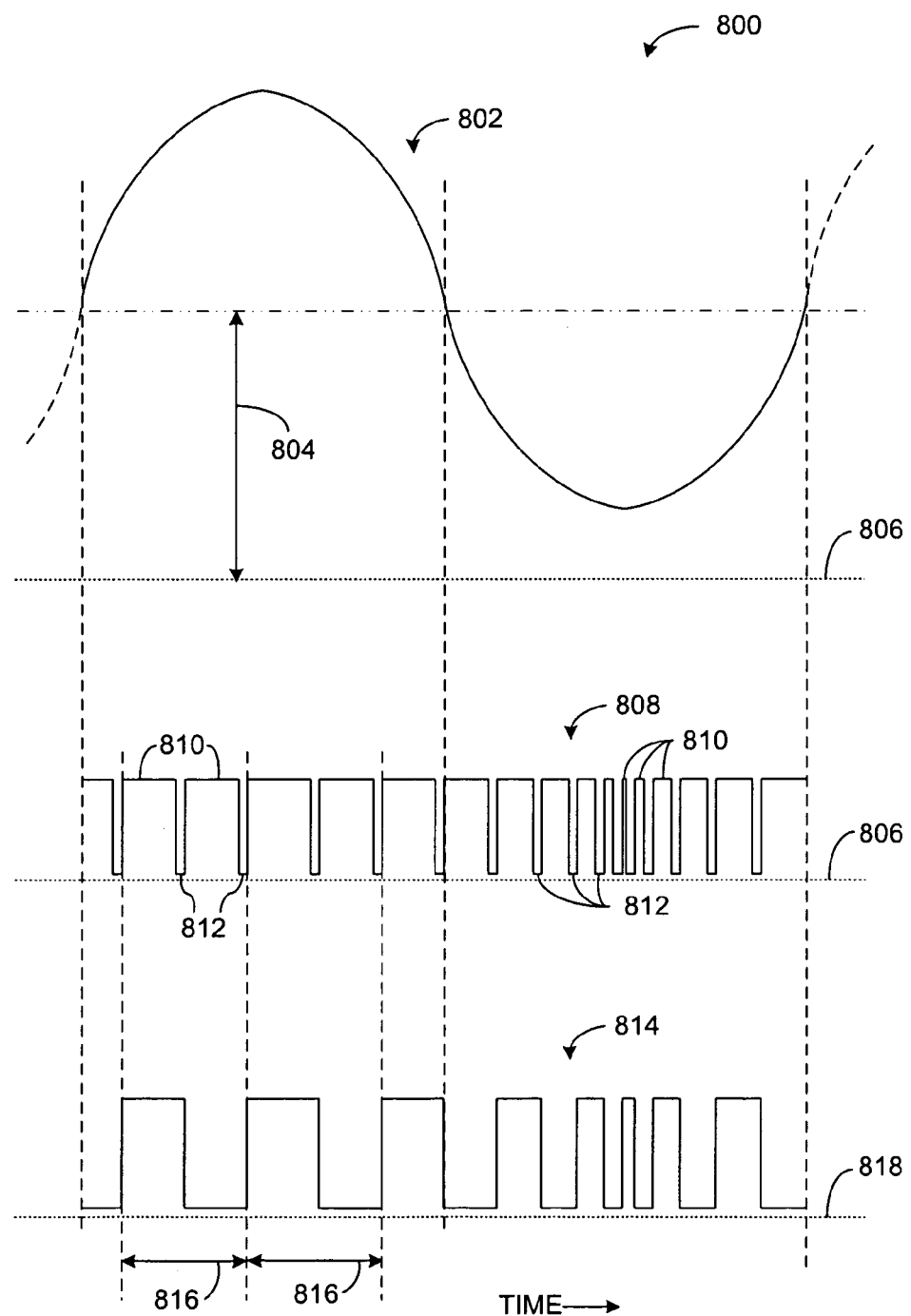
FIG. 8 depicts a signal timing diagram of illustrative signals according to one embodiment.

Attention is now directed to FIG. 8, which depicts a signal timing diagram 800. The diagram 800 is illustrative and non-limiting with respect to the signal derivation circuitry 100 of the present teachings. Therefore, the diagram 800 depicts respective signals and their relationships for purposes of understanding the present teachings. Other operative scenarios including signals whose respective characteristics (e.g., frequency, waveform, magnitude, timing, sampling rate, etc.) differ from those depicted in FIG. 8 are also contemplated by the present teachings.

The diagram 800 includes a scaled and biased voltage signal 802. The signal 802 is illustrative of a signal that can be present at node 226, which corresponds to a load voltage present at node 104A. In the alternative the signal 802 can be illustrative of a signal that present at node 524, which corresponds to a load current 108. The signal 802 is substantially sinusoidal in form and is superimposed on a DC bias 804 with reference to a ground level 806. One of ordinary skill in the electrical arts can appreciate that the signal 802 is defined by various characteristics such as peak-to-peak magnitude, frequency, period, etc., and that an exhaustive description of these characteristics is unnecessary for understanding the teachings herein.

The diagram 800 also includes a frequency-modulated (FM) signal 808. The FM signal 808 is illustrative of a signal that can be present at node 304A, which is the output signal from the oscillator 342. In the alternative the signal 808 can be illustrative of a signal present at node 604A, which is the output from the oscillator 632.

The signal 808 is characterized by a succession of cycles each defined by a respective "ON" period 810, and a respective "OFF" period 812. The length of each ON (i.e., high) period 810 corresponds to the average magnitude of the signal 802 during that sampling period. In turn, the length of each OFF (i.e.; low) period 812 corresponds to the discharge time (Td) of the oscillator (342 or 632, etc.). During typical operation of the signal derivation circuitry 100, the respective OFF periods 812 are equal.

The diagram 800 further includes a frequency-modulated signal 814. The FM signal 814 is illustrative of a signal that can be present at node 420, which is the isolated output signal corresponding to a load voltage 104A. In the alternative the signal 814 can be illustrative of a signal present at node 716, which is the isolated output signal corresponding to a load current 108.

The signal 814 oscillates at one-half of the instantaneous frequency of the signal 808. Furthermore, the signal 814 is characterized by a chronological succession of respective periods 816. Each period 816 corresponds to—and is essentially an average of—two full cycles (i.e., periods) of the signal 808. Thus, each period 816 corresponds to the average magnitude of the signal 802 that is sampled during two consecutive cycles of the signal 808. As such, each period 816 includes two OFF periods 812 (i.e., discharge times Td) of the signal 808. Additionally, the signal 814 is defined relative to an isolated ground potential 818.

The signal 814 is illustrative of an isolated frequency-modulated signal that is provided by signal derivation circuitry 100. Such a signal 814 is typically coupled to signal processing and/or other control circuitry for use in controlling a printer or other apparatus. The signal 814 includes a non-linearity attributable to the discharge times 812 present within the frequency-modulated signal 808 provided by the corresponding oscillator 342 or 632. Processing of the signal 814 according to the present teachings is considered with reference to FIG. 9.

First Illustrative Method

Figure 9:
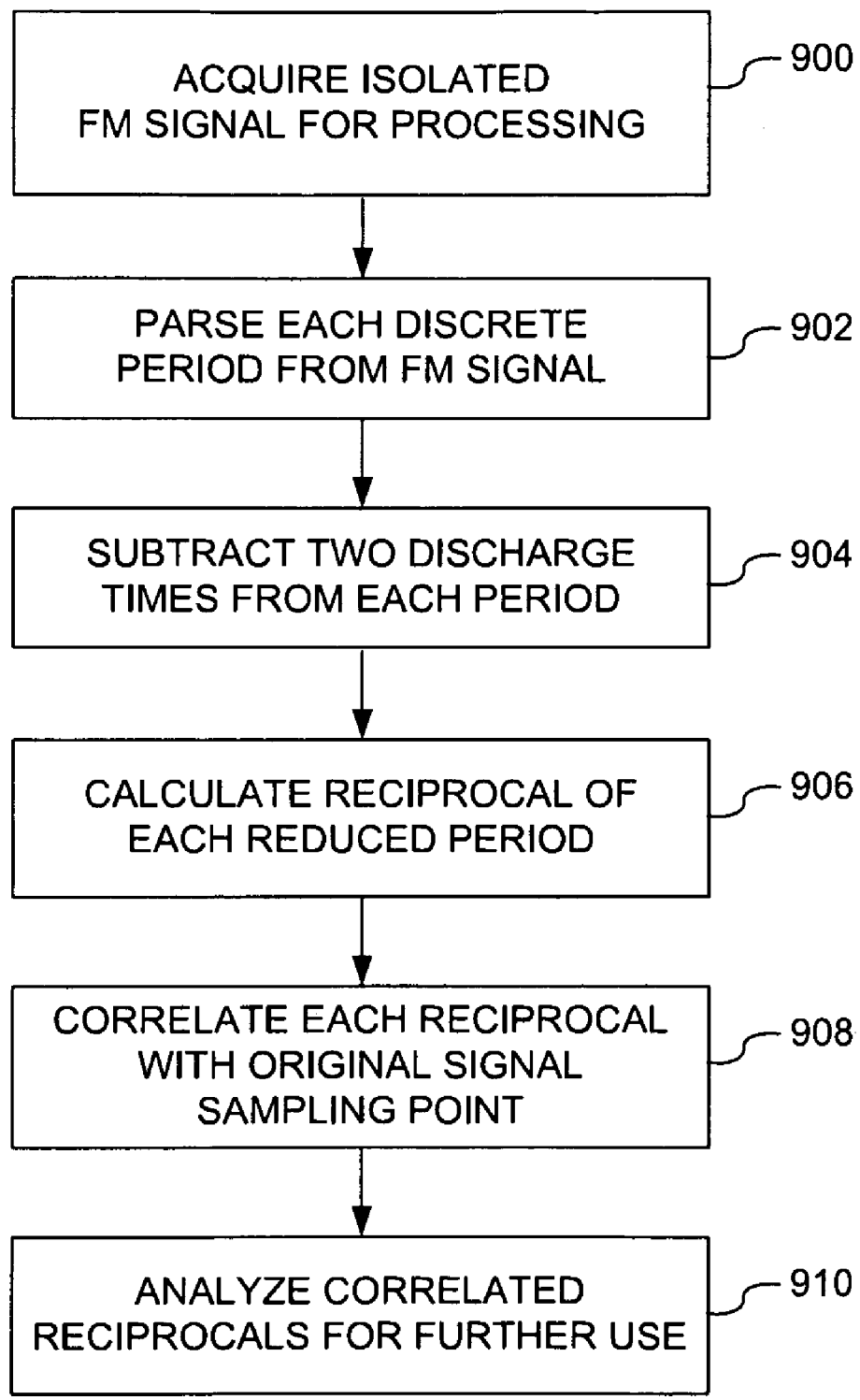
FIG. 9 depicts a flow diagram of a method according to another embodiment.

FIG. 9 is a flow diagram depicting a signal processing method according to one embodiment of the invention. The method of FIG. 9 includes particular operations and order of execution. However, other methods including other operations, omitting one or more of the depicted operations, and/or proceeding in other orders of execution can also be used according to the present teachings. Thus, the method of FIG. 9 is illustrative and non-limiting in nature.

At 900, an isolated, frequency-modulated signal 814 is acquired for processing.

At 902, each period 816 of the signal 814 is discretely identified and parsed for individual manipulation.

At 904, the equivalent of two OFF periods 812 is subtracted from each discrete period 816, yielding respective processed periods.

At 906, the reciprocal of each processed period is calculated so as to derive the corresponding frequency of each period 816, having the discharge times 812 (i.e., offset signal content) removed.

At 908, each calculated reciprocal is correlated to a particular point on (or portion of) the signal 808. In this way, time correspondence between each period 816 and the signal 808 is determined.

At 910, the respective frequency for each period 816 is used to interpret or otherwise analyze the load voltage (or current).

The foregoing method is illustrative of any number of methods contemplated by the present teachings. Such signals can be used in controlling a printer. Numerous other methods consistent with the operations and/or objectives of the present teachings can also be used.

Second Illustrative Embodiment

Figure 10:
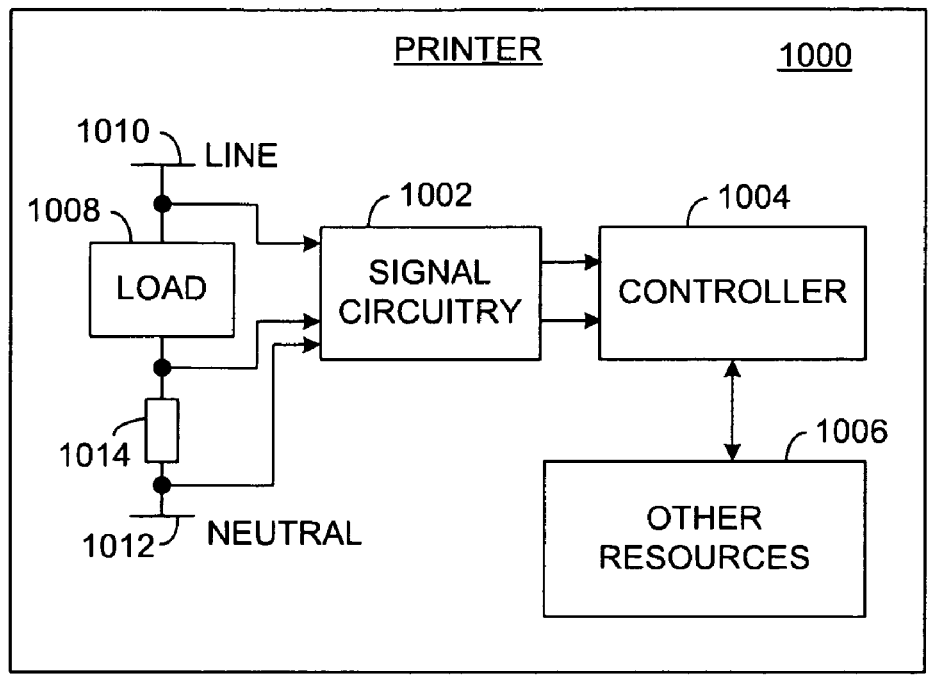
FIG. 10 depicts a block diagram of a printer according to another embodiment.

Attention is now directed to FIG. 10, which depicts a block diagrammatic view of a printer 1000. The printer 1000 is illustrative and non-limiting with respect to the present teachings. Thus, the present teachings contemplate an essentially unlimited number of application scenarios in which voltage, current and/or power monitoring is required and/or desirable.

The printer 1000 includes signal derivation circuitry 1002. In one embodiment, the signal derivation circuitry 1002 is as depicted and described above with respect to FIGS. 2-7, collectively. Other embodiments of signal derivation circuitry 1002, consistent with the present teachings, can also be used. The signal derivation circuitry 1002 is configured to monitor (i.e., sense) voltage and current of a load or loads 1008 of the printer 1000 and to provide corresponding isolated, frequency-modulated signals for use in controlling operations of the printer 1000.

The printer 1000 also includes a controller (or control circuitry) 1004. The controller 1004 is configured to control numerous normal operations of the printer 1000 such as, for non-limiting example, formation of imaging on media, receiving input from a user interface, communicating data to and/or from a network connection (not shown), etc. The control 1004 is configured and coupled so as to have controlling influence over various other resources 1006 of the printer 1000 (e.g., inkjet print head(s), media transport mechanisms, user input/output circuitry, network communications resources, memory and/or other data storage, etc.).

The printer 1000 also includes a load 1008. The load 1008 can be defined as any electrical load or resource of the printer 1000 for which monitoring of the applied electrical voltage and current is required. For purposes of non-limiting example, it is assumed that the load 1008 is defined by a power supply configured to derive one or more DC and/or AC voltages from a single AC electrical source (e.g., utility power).

The load 1008 is energized by electrical power from a line-level voltage node 1010, and a neutral-level (with respect to line-level) voltage node 1012. For purposes of non-limiting example, it is assumed that there are normally one-hundred twenty volts (RMS) at sixty Hertz frequency between line-level node 1010 and neutral-level node 1012. Other voltages and/or other frequencies can also be used in other embodiments.

The load 1008 is coupled to neutral node 1012 by way of current sense resistor 1014. The current sense resistor 1014 is configured to exhibit a voltage drop corresponding to the current drawn by the load 1008. In turn, the line-level voltage at node 1010, the neutral-level voltage at node 1012, and the voltage across the resistor 1014 (with respect to node 1012) are coupled to the signal derivation circuitry 1002.

During illustrative, non-limiting operation, the printer 1000 performs as follows: normal printing operations are performed under the control of controller 1004. The signal derivation circuitry 1002 monitors the voltage applied to and current carried by the load 1008. The signal derivation circuitry 1002 also operates to derive corresponding frequency-modulated voltage and current signals, communicates these signals across electrical isolation barriers between distinct electrical domains, and provides the resulting isolated signals to the controller 1004.

The controller 1004 is further configured to process the isolated signals provided by the signal derivation circuitry 1002. For example, and not by limitation, the controller 1004 can be configured to perform the method of FIG. 9 as described above. The controller 1004 is also configured to adjust the control of the printer resources 1006 in accordance with the (processed) signals. For purposes of non-limiting example, it is assumed that the voltage between nodes 1010 and 1012 drops (or sags) below a threshold value. Corresponding signals from the signal derivation circuitry 1002 are sent to the controller 1004, which processes those signals and responds by reducing the energy delivered to an electrical media drying heater such that the present electrical demands of the printer 1000 are reduced. Other operational scenarios are also possible.

The printer 1000 is illustrative and non-limiting with respect to the present teachings. Furthermore, the printer 1000 is depicted in a simplified form in the interest of understanding. One having ordinary skill in the printing and related arts will appreciate that other printers having respectively varying resources can be configured and used in accordance with the present subject matter.

Second Illustrative Method

Figure 11:
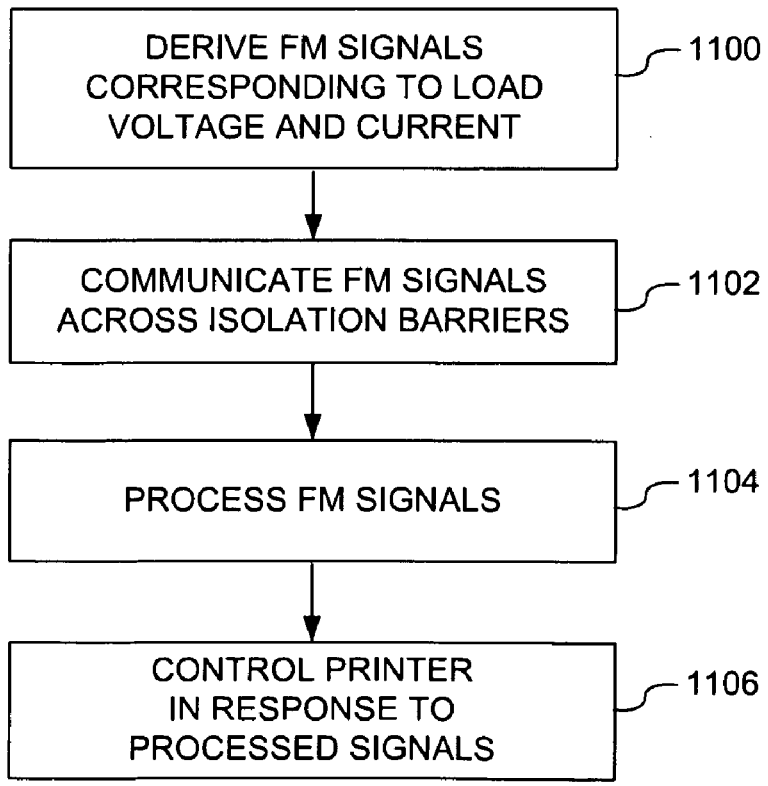
FIG. 11 depicts a flow diagram of a method according to yet another embodiment.

FIG. 11 is a flow diagram depicting a method according to one embodiment of the invention. The method of FIG. 11 includes particular operations and order of execution. However, other methods including other operations, omitting one or more of the depicted operations, and/or proceeding in other orders of execution can also be used according to the present teachings. Thus, the method of FIG. 11 is illustrative and non-limiting in nature.

At 1100, load voltage and current are monitored by signal derivation circuitry, and corresponding frequency-modulated (FM) signals representative of the voltage and current are derived. For purposes of non-limiting example, such signal derivation circuitry can be defined and configured as depicted by FIGS. 2-7, collectively.

At 1102, the frequency-modulated signals derived at 1100 above are communicated across respective electrical isolation barriers. Such communication results in transferring the signals between distinct electrical domains. The electrical domains can optionally have respectively different voltage ranges.

At 1104, the isolated, frequency-modulated signals representative of load voltage and current are provided to a printer controller. The controller acts to process the signals (e.g., remove offset signal content, correlate the signals to sample points, etc.) accordingly for further use.

At 1106, the processed signals are used to control operations of the printer. For non-limiting example, a media dryer within the printer can be modulated in accordance with power variations experienced by a corresponding power supply. Other control scenarios are also possible.

The foregoing method is illustrative of any number of methods contemplated by the present teachings such that frequency-modulated signals representative of applied voltage and current of a load are derived and communicated across electrical isolation barriers. As in the method of FIG. 11, such signals can be processed and used in controlling a printer. Numerous other methods consistent with the operations and/or objectives of the present teachings can also be used.

In general, the foregoing description is intended to be illustrative and not restrictive. Many embodiments and applications other than the examples provided would be apparent to those of skill in the art upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future embodiments. In sum, it should be understood that the invention is capable of modification and variation and is limited only by the following claims.

What is claimed is:

1. An apparatus, comprising:
   first modulator circuitry configured to provide a first frequency-modulated signal corresponding to a voltage applied to a load;
   second modulator circuitry configured to provide a second frequency modulated signal corresponding to a current through the load; and
   control circuitry configured to process the first and second frequency-modulated signals so as to derive first and second processed signals respectively, the processing including removing offset signal content from the first and second frequency-modulated signals, the control circuitry also configured to control one or more aspects of the apparatus by way of the first and second processed signals.

2. The apparatus according to claim 1, the processing including correlating the first and second processed signals to the first and second frequency-modulated signals respectively.

3. The apparatus according to claim 1 further comprising voltage processing circuitry configured to scale and bias the voltage applied to the load so as to derive a signal, the signal being provided to the first modulator circuitry.

4. The apparatus according to claim 1 further comprising current processing circuitry configured to scale and bias a voltage corresponding to the current through the load so as to derive a signal, the signal being provided to the second modulator circuitry.

5. The apparatus according to claim 1 further comprising barrier circuitry configured to couple the first frequency-modulated signal or the second frequency-modulated signal from a first voltage domain to a second voltage domain by way of an optical isolator.

6. The apparatus according to claim 1, the load being part of a printing device.

7. A printing apparatus, comprising:
   an electrical load;
   signal derivation circuitry configured to provide a first electrically isolated signal corresponding to a voltage applied to the electrical load, the signal derivation circuitry also configured to provide a second electrically isolated signal corresponding to a current through the electrical load; and
   signal processing circuitry configured to remove offset signal content from the first and second electrically isolated signals and to derive first and second processed signals respectively.

8. The printing apparatus according to claim 7, the signal derivation circuitry further configured such that at least the first electrically isolated signal or the second electrically isolated signal is also a frequency-modulated signal.

9. The printing apparatus according to claim 7, the voltage applied to the electrical load being an alternating-current voltage.

10. The printing apparatus according to claim 7, the signal derivation circuitry including at least one oscillator operating by way of charging and discharging a capacitor.

11. The printing apparatus according to claim 10, the signal derivation circuitry further configured such that an oscillator provides an output signal to a flip-flop, the flip-flop configured to provide a frequency-modulated output signal.

12. The printing apparatus according to claim 11, the signal processing circuitry further configured to correlate either the first processed signal or the second processed signal to the output signal provided by the oscillator.

13. A method, comprising:
 deriving a first frequency-modulated signal corresponding to a load voltage;
 deriving a second frequency-modulated signal corresponding to a load current; and
 communicating the first and second frequency-modulated signals across respective electrical isolation barriers from a first voltage level to a second voltage level;
 processing the first frequency-modulated signal and the second frequency-modulated signal so as to derive a first processed signal and a second processed signal respectively; and
 using the first and second processed signals to control operations of a printer.

14. The method according to claim 13, the processing further comprising removing discharge times of an oscillator operating period from the first frequency-modulated signal and the second frequency-modulated signal.

15. The method according to claim 14, the processing further comprising:
 correlating the first processed signal with the first frequency-modulated signal; and
 correlating the second processed signal with the second frequency-modulated signal.

* * * * *